United States Patent
Adkisson et al.

(10) Patent No.: US 8,105,861 B2
(45) Date of Patent: Jan. 31, 2012

(54) CMOS IMAGE SENSOR WITH REDUCED DARK CURRENT

(75) Inventors: James W. Adkisson, Jericho, VT (US); Rajendran Krishnasamy, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/885,648

(22) Filed: Sep. 20, 2010

(65) Prior Publication Data

US 2011/0008925 A1 Jan. 13, 2011

Related U.S. Application Data

(62) Division of application No. 12/056,305, filed on Mar. 27, 2008, now Pat. No. 7,800,147.

(51) Int. Cl.
*H01L 21/00* (2006.01)
(52) U.S. Cl. ... 438/59; 257/292; 257/466; 257/E21.041; 438/57
(58) Field of Classification Search .................. 257/292, 257/462, 466, E31.019, E21.041–E21.043; 438/57, 59
See application file for complete search history.

(56) References Cited

U.S. PATENT DOCUMENTS

| | | | |
|---|---|---|---|
| 6,358,806 B1 | 3/2002 | Puchner | |
| 7,154,136 B2 | 12/2006 | Cole et al. | |
| 7,196,391 B2 | 3/2007 | Hsieh | |
| 7,385,238 B2 | 6/2008 | Mouli | |
| 7,400,004 B2 | 7/2008 | Cole et al. | |
| 7,521,737 B2 | 4/2009 | Augusto | |
| 7,544,530 B2* | 6/2009 | Han | 438/48 |
| 7,732,845 B2* | 6/2010 | Adkisson et al. | 257/292 |
| 7,994,554 B2* | 8/2011 | Han | 257/292 |
| 2006/0033132 A1 | 2/2006 | Mouli | |
| 2006/0226503 A1 | 10/2006 | Cole et al. | |
| 2007/0012963 A1* | 1/2007 | Han | 257/290 |
| 2008/0237682 A1 | 10/2008 | Chiang | |
| 2009/0224298 A1* | 9/2009 | Han | 257/292 |
| 2009/0250733 A1 | 10/2009 | Adkisson et al. | |

* cited by examiner

*Primary Examiner* — Allan R Wilson
(74) *Attorney, Agent, or Firm* — Scully, Scott, Murphy and Presser, P.C.; Anthony J. Canale

(57) ABSTRACT

A carbon-containing semiconductor layer is formed on exposed surfaces of a p– doped semiconductor layer abutting sidewalls of a shallow trench. Following formation of a dielectric layer on the carbon-containing semiconductor layer, a surface pinning layer having a p-type doping is formed underneath the carbon-containing semiconductor layer. A shallow trench isolation structure and a photodiode are subsequently formed. Diffusion of defects directly beneath the shallow trench isolation structure, now contained in the carbon-containing semiconductor layer, is suppressed. Further, boron diffusion into the shallow trench isolation structure and into the photodiode is also suppressed by the carbon-containing semiconductor layer, providing reduction in dark current and enhancement of performance of the photodiode.

7 Claims, 12 Drawing Sheets

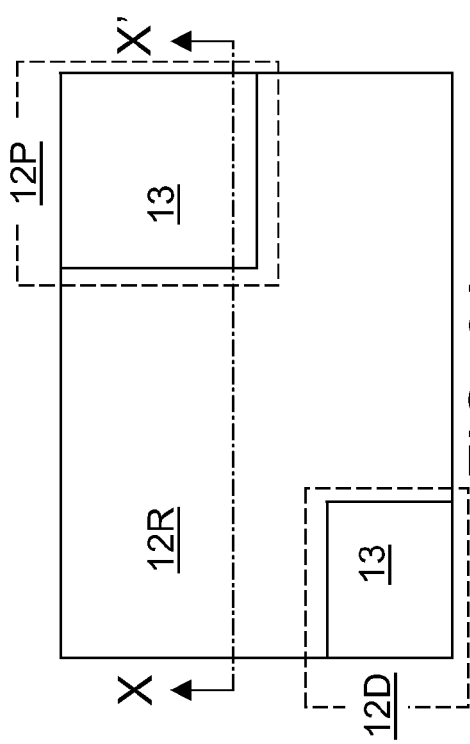
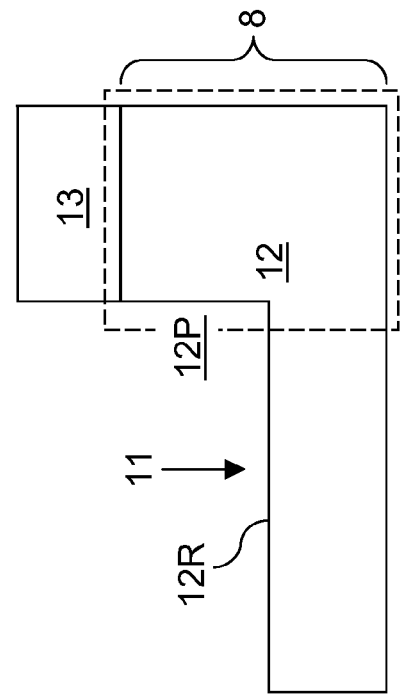
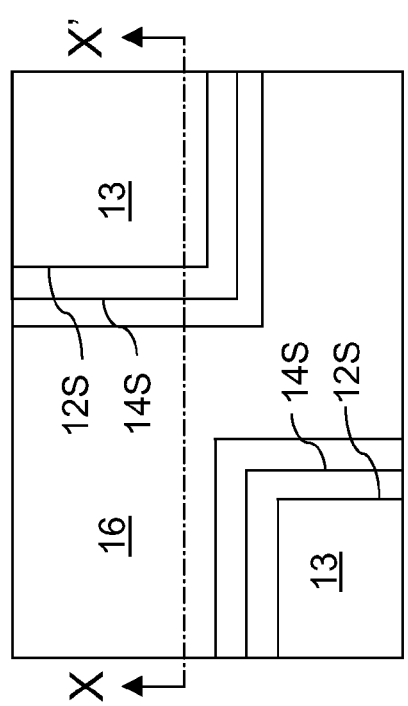
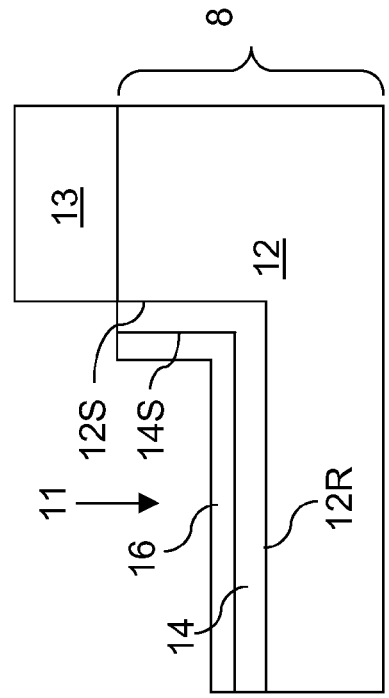

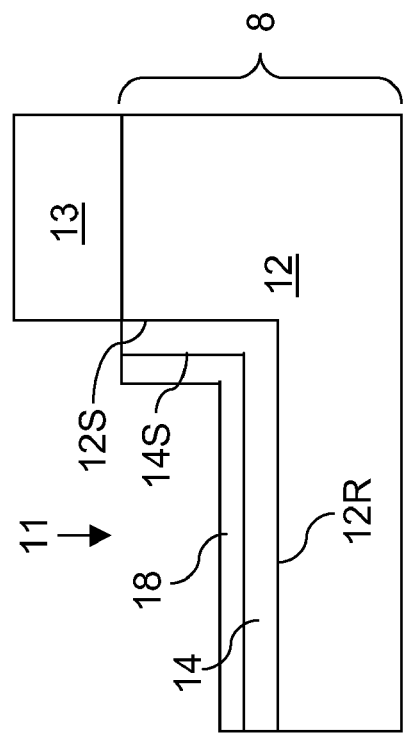
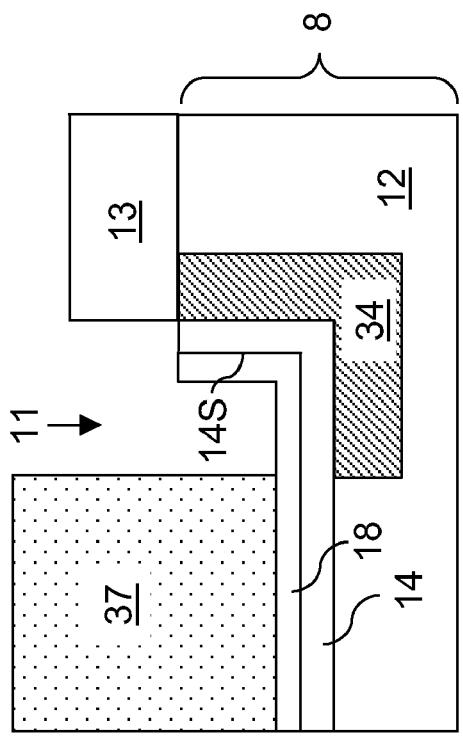
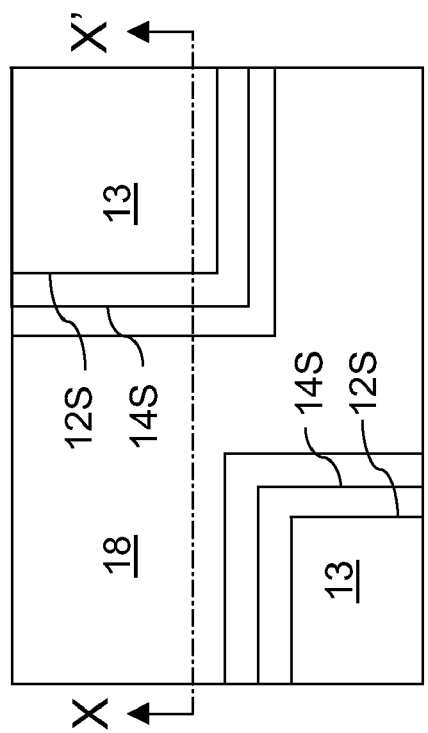
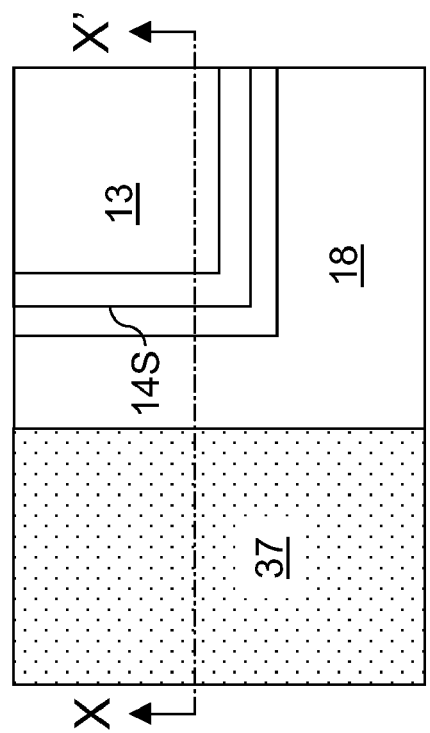
FIG. 4A
FIG. 4B
FIG. 5A
FIG. 5B

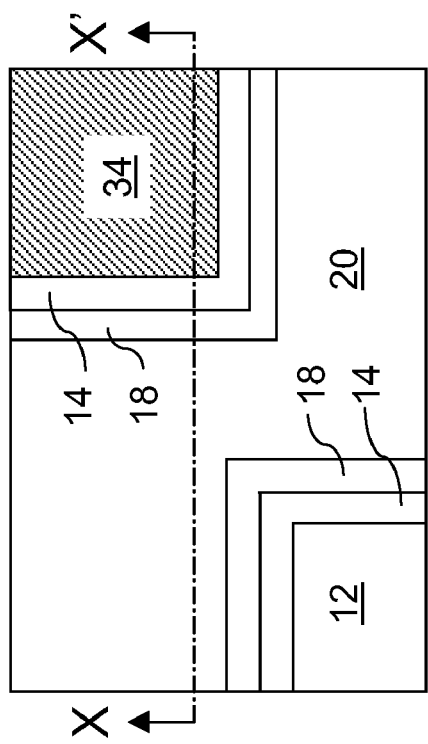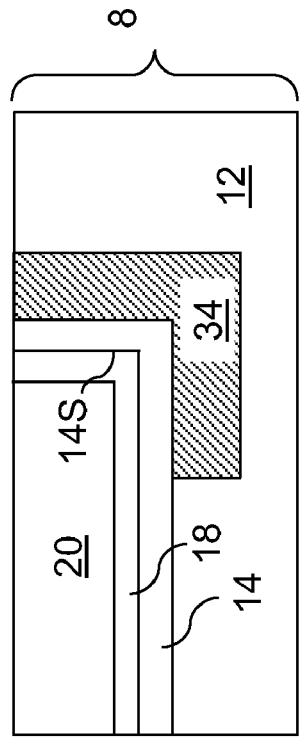
FIG. 6A     FIG. 6B
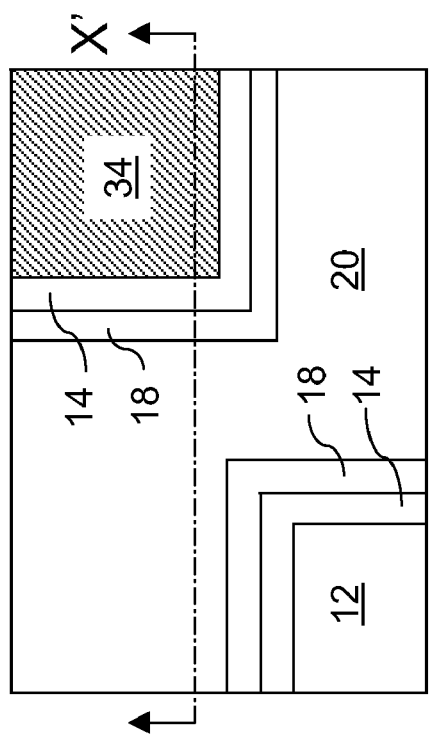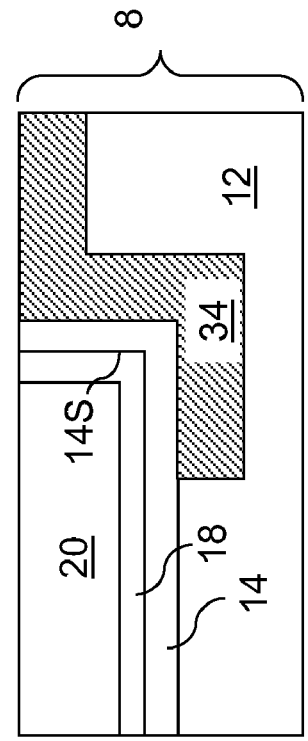
FIG. 7A     FIG. 7B

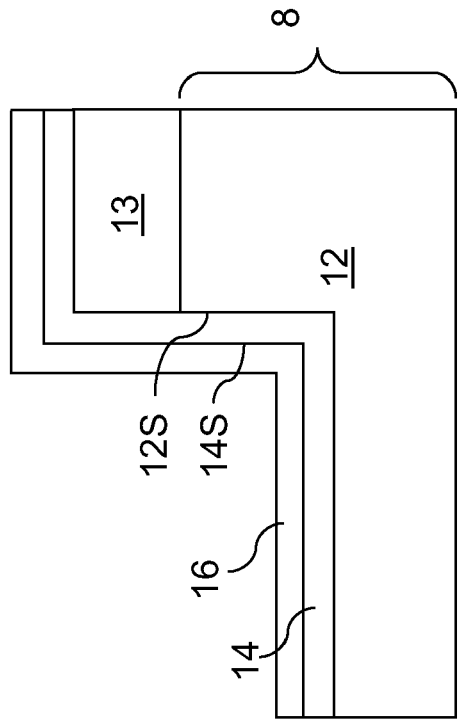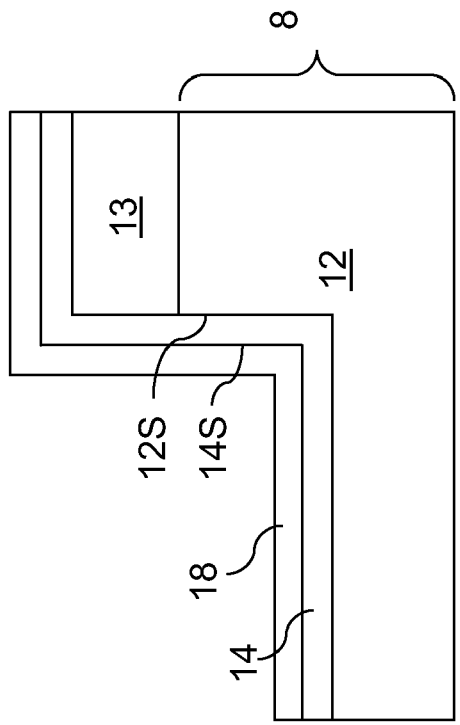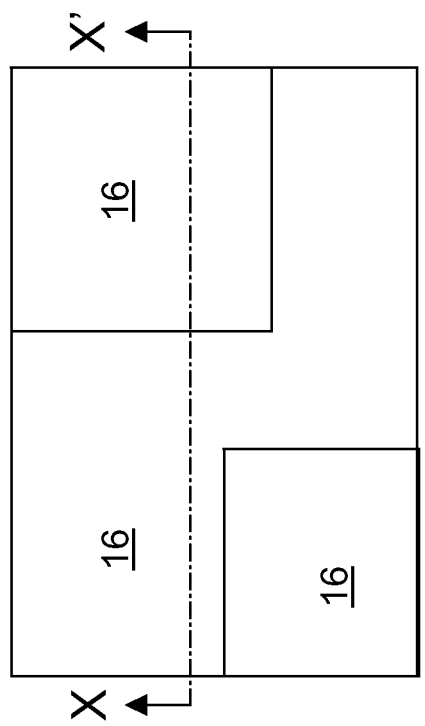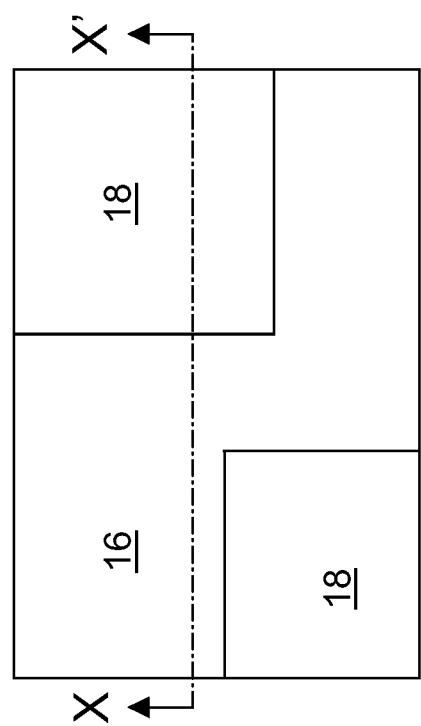

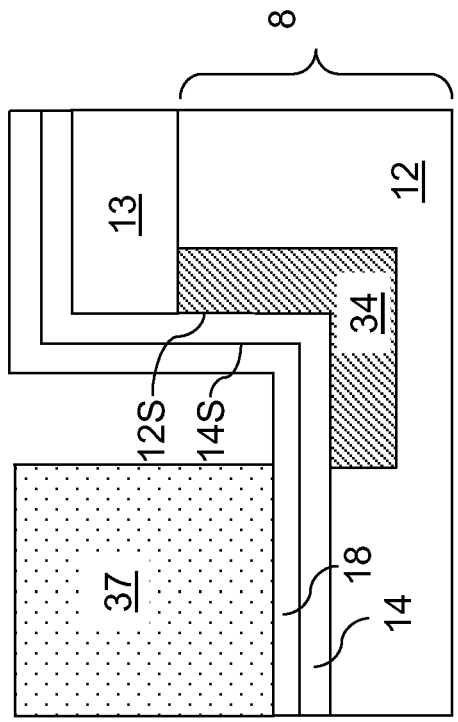
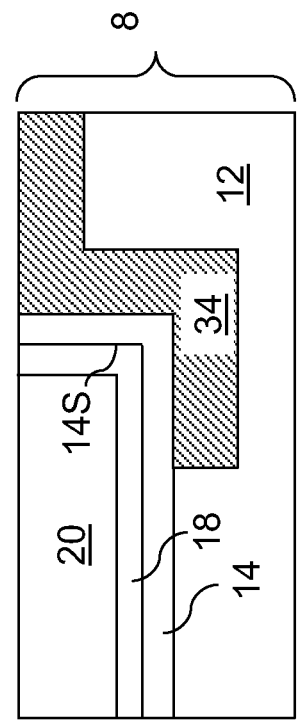
FIG. 11A
FIG. 11B
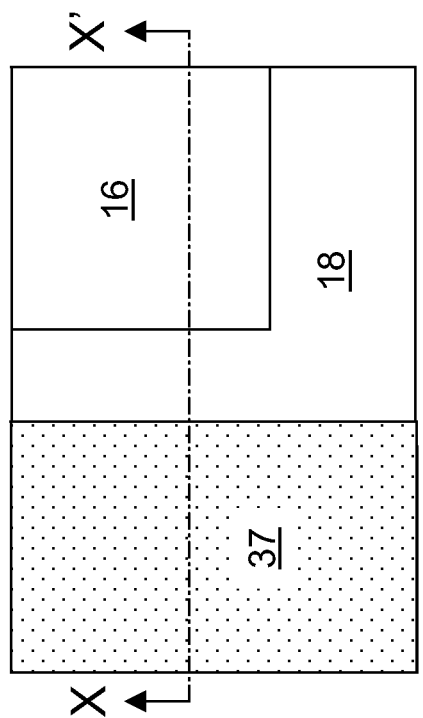
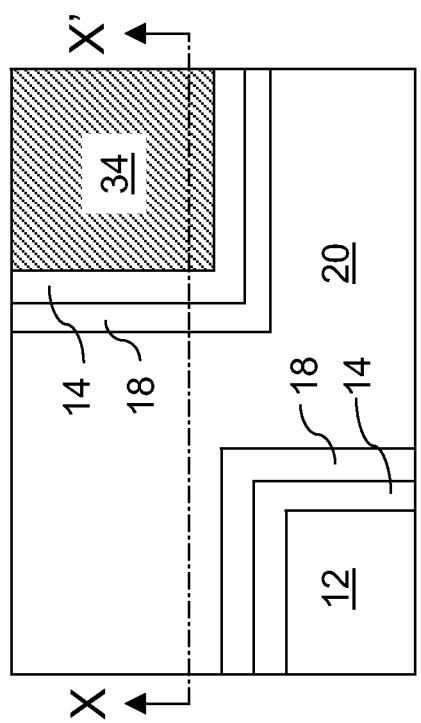
FIG. 12A
FIG. 12B

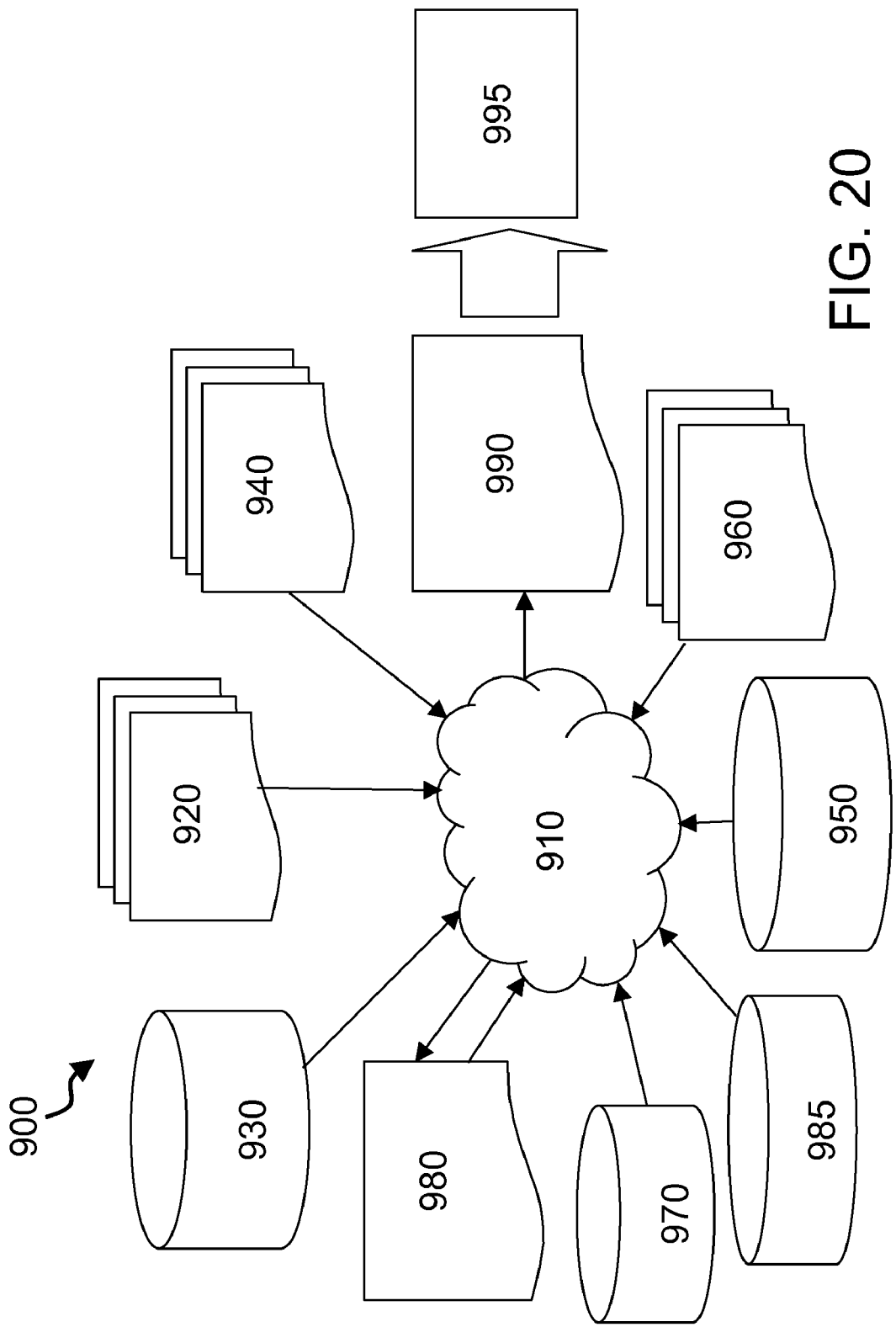

CMOS IMAGE SENSOR WITH REDUCED DARK CURRENT

CROSS REFERENCE TO RELATED APPLICATION

This application is a divisional of U.S. patent application Ser. No. 12/056,305, filed Mar. 27, 2008 the entire content and disclosure of which is incorporated herein by reference.

FIELD OF THE INVENTION

The present invention relates to a semiconductor structure, and particularly to a complementary metal oxide semiconductor (CMOS) image sensor structure formed on a semiconductor substrate containing a silicon-carbon layer abutting sidewalls and bottom surfaces of a shallow trench isolation structure, and methods of manufacturing the same.

BACKGROUND

An image sensor converts a visual image to digital data that may be represented by a picture. The image sensor comprises an array of pixels, which are unit devices for the conversion of the visual image into the digital data. Digital cameras and optical imaging devices employ an image sensor. Image sensors include charge-coupled devices (CCDs) or complementary metal oxide semiconductor (CMOS) image sensors.

While CMOS image sensors have been more recently developed compared to the CCDs, CMOS image sensors provide an advantage of lower power consumption, smaller size, and faster data processing than CCDs as well as direct digital output that is not available in CCDs. Also, CMOS image sensors have lower manufacturing cost compared with the CCDs since many standard semiconductor manufacturing processes may be employed to manufacture CMOS image sensors. For these reasons, commercial employment of CMOS image sensors has been steadily increasing in recent years.

Referring to FIG. 1, an exemplary prior art device, which is a portion of a CMOS image sensor pixel, includes semiconductor substrate 108 and a gate structure for a transfer gate transistor. The semiconductor substrate 108 comprises a p+ doped semiconductor layer 110, a p− doped semiconductor layer 112, and a shallow trench isolation structure 120. The semiconductor substrate 108 further comprises a photodiode and a surface pinning layer 134 having a p-type doping. The photodiode comprises an n-type charge collection well 130 located beneath the surface pinning layer 134 and a p-type well 132, which is a portion of the p− doped semiconductor layer 112 and vertically abuts the p+ doped semiconductor layer 110. The transfer gate transistor is integrally formed with the photodiode (130, 132) such that the n-type charge collection well 130, which comprises an n+ doped semiconductor material, is also a source of the transfer gate transistor. The transfer gate transistor further comprises a floating drain 140 located in the semiconductor substrate 108, a gate dielectric 150 located directly on a portion of the p− doped semiconductor layer that functions as a channel (corresponding to a straight arrow in FIG. 1), a gate electrode 152, and a gate spacer 154.

A p-n junction and a depletion region is formed between the p-type well 132 and the n-type charge collection well 130. A photon impinging on the photodiode (132, 130) generates an electron-hole pair if the photon interacts with the semiconductor material in the photodiode (132, 130). The energy of the photon that induces electron-hole pair generation depends on the type of the semiconductor material in the semiconductor substrate 108, but the wavelength range of photons for the photogeneration of an electron-hole pair is from about 190 nm to about 1,100 nm for silicon, from about 400 nm to about 1,700 nm for germanium, and from about 800 nm to about 2,600 nm for indium gallium arsenide, respectively.

If the electron-hole pair is generated within the depletion region of the photodiode, which comprises the p-type well 134 and the n-type charge collection well 132, the charge carriers (holes and electrons) drift apart due to the kinetic energy imparted to the charge carriers during the photogeneration process. If a minority carrier (a hole in the n-type charge collection well 130 or an electron in the p-type well 132) enters into the depletion region by drifting, the electric field inherent in the depletion region of the photodiode (132, 130) sweeps the carrier across the p-n junction, which then becomes a majority carrier, i.e., a hole in the p-type well 132 or an electron in the n-type charge collection well 130, upon crossing the p-n junction, and producing a photocurrent if the circuit is closed, or accumulates charges. Particularly, if the carrier is an electron, the carrier accumulated in the n-type charge collection well 132. The amount of charge that accumulates in the n-type charge collection well 132 is nearly linear to the number of incident photons (assuming the photons have the same energy distribution). If the minority carrier recombines with the majority carriers within the photodiode (132, 130) prior to entering the depletion region, the minority carrier is "lost" through recombination and no current or charge accumulation results.

During a read out of the charge from the photodiode (132, 130), electrons in the n-type charge collection well 130 is transferred through the body of the transistor to the floating drain 140 of the transfer transistor. The transfer of the charge needs to be complete to maximize the signal strength from the pixel and to avoid any image lag. If there is a potential barrier between the n-type charge collection well 130 and the channel of the transfer transistor, all of the charge may not be transferred during a read operation or a reset operation.

One of the key technological challenges in currently available CMOS image sensors is degradation of image quality due to dark current and bright points, which reduce charge capacity and reduce dynamic range of a CMOS image sensor. Dark current is the leakage current generated in a photodiode of a CMOS image sensor pixel. The dark current has two components, "ideal dark current" and "defect generated dark current."

The ideal dark current depends on the doping concentrations, band gap, and the temperature of the photodiode, which is typically reverse biased. The ideal dark current comprises injection-diffusion current due to the injection of thermal electrons and holes having a higher energy than the built-in potential energy to an opposite side of the p-n junction, which becomes a minority carrier diffusion current. The ideal dark current also comprises generation-recombination current due to thermal electron-hole generation or recombination within the depletion region. The two components of the ideal dark current are dependent on applied voltage and temperature. The ideal dark current is a result of inherent limitations of the material properties of the photodiode.

The defect-generated dark current is determined by characteristics of individual defects in the structure of the photodiode. Properties of the material employed in the construction of the photodiode and supporting devices induce electrical charges in the photodiode through various mechanisms including junction leakage of the photodiode, leakage current generated around a shallow trench isolation structure, subthreshold leakage of transistors connected to the photodiode, drain-induced-barrier-lowering (DIBL) leakage current and gate-induced drain leakage current of such transistors, and other leakages through structural defects and/or limitations of structures of the photodiode itself and surrounding structures. Such dark current reduces the dynamic range of affected CMOS image sensor pixels, and degradation of performance of optical devices employing the CMOS image sensors.

Of particular significance among the various causes of leakage current is the leakage current around a shallow trench isolation structure due to the material properties at the interface between the shallow trench isolation structure and the silicon substrate. Particularly, the point defects within the sidewalls of the silicon substrate that adjoin the shallow trench isolation structure generate surface states that functions as leakage paths for electrical charges. Further, the dopant ions in general, and boron ions in particular, that are introduced into the shallow trench isolation structure during ion implantation steps affect surface passivation of the silicon substrate that abut the shallow trench isolation structure, and generate interface charge states that also function as leakage paths for electrical charges.

Presence of structural defects in a semiconductor material near the interface with a shallow trench isolation structure provides leakage paths that contribute to an increase in the dark current. Also, boron diffusion from the semiconductor material into the shallow trench isolation structure increases dark current by generation of surface states by boron ions present near the interface. Further, boron ions are fast diffusers that diffuse through the photodiode region and effectively reduce the p-n junction depletion region of the photodiode. This results in reduction of charge capacity of the photodiode, and may lead to degradation in image quality from a CMOS image sensor pixel.

In view of the above, there exists a need for a CMOS image sensor structure that provides trapping of defects near a shallow trench isolation structure interface and reduction in boron diffusion into a photodiode to provide enhanced performance of the photodiode in terms of reduced dark current and enhanced charge capacity, and methods of manufacturing the same.

SUMMARY

To address the needs described above, the present invention provides a semiconductor structure comprising a CMOS image sensor structure containing a carbon-containing semiconductor layer that retards diffusion of boron from a shallow trench isolation structure into a photodiode, and methods of manufacturing the same.

In the present invention, a carbon-containing semiconductor layer is formed on exposed surfaces of a p− doped semiconductor layer abutting sidewalls of a shallow trench. Following formation of a dielectric layer on the carbon-containing semiconductor layer, a surface pinning layer having a p-type doping is formed underneath the carbon-containing semiconductor layer. A shallow trench isolation structure and a photodiode are subsequently formed. Diffusion of defects directly beneath the shallow trench isolation structure, now contained in the carbon-containing semiconductor layer, is suppressed. Further, boron diffusion into the shallow trench isolation structure and into the photodiode is also suppressed by the carbon-containing semiconductor layer, providing reduction in dark current and enhancement of performance of the photodiode.

According to an aspect of the present invention, a semiconductor structure is provided, which comprises:

a p− doped semiconductor layer located in a semiconductor substrate;

an n-type charge collection well vertically abutting the p− doped semiconductor layer;

a surface pinning layer having a p-type doping and vertically abutting a top surface of the n-type charge collection well and laterally abutting a sidewall of the n-type charge collection well;

a carbon-containing semiconductor layer comprising a semiconductor material and carbon and laterally abutting the surface pinning layer and a substantially vertical portion of a dielectric layer and vertically abutting a horizontal portion of the dielectric layer, and a shallow trench isolation structure abutting the dielectric layer.

In one embodiment, the semiconductor structure further comprises a p+ doped semiconductor layer located directly underneath the p− doped semiconductor layer.

In another embodiment, the p− doped semiconductor layer, the n-type charge collection well, and the surface pinning layer comprise the semiconductor material of the carbon-containing semiconductor layer.

In even another embodiment, the semiconductor material is one of silicon, a silicon germanium alloy, silicon, germanium, a silicon-germanium alloy, a silicon carbon alloy, a silicon-germanium-carbon alloy, gallium arsenide, indium arsenide, indium gallium arsenide, indium phosphide, lead sulfide, other III-V compound semiconductor materials, and II-VI compound semiconductor materials.

In yet another embodiment, the semiconductor material is silicon, and a carbon concentration of the carbon-containing semiconductor layer is from about 0.1% to about 5% in atomic concentration.

In still another embodiment, the p− doped semiconductor layer, the n-type charge collection well, the surface pinning layer, and the carbon-containing semiconductor layer are epitaxially aligned as a single crystal.

In still yet another embodiment, the semiconductor structure further comprises a transfer transistor including a floating drain located in the semiconductor substrate, a gate dielectric vertically abutting a top surface of the p− doped semiconductor layer, and a gate electrode vertically abutting the gate dielectric, wherein the n-type charge collection well functions as a source of the transfer transistor.

In a further embodiment, the surface pinning layer abuts the p− doped semiconductor layer, and a portion of the surface pinning layer is located under the shallow trench isolation structure.

According to another aspect of the present invention, a method of forming a semiconductor structure is provided, which comprises:

forming a shallow trench in a p− doped semiconductor layer in a semiconductor substrate; forming a carbon-containing semiconductor layer on a sidewall surface and a bottom surface of the shallow trench;

implanting p-type dopants into a portion of the p− doped semiconductor layer and forming a surface pinning layer having a p-type doping, wherein a dopant concentration of the surface pinning layer is higher than a dopant concentration of the p− doped semiconductor layer; and forming an n-type charge collection well underneath a top portion of the surface pinning layer, wherein the n-type charge collection well laterally abuts a vertical portion of the surface pinning layer.

In one embodiment, the carbon-containing semiconductor layer is deposited by epitaxial growth and is in epitaxial alignment with the p− doped semiconductor layer.

In another embodiment, the method further comprises:

depositing a semiconductor material layer directly on the carbon-containing semiconductor layer;

converting the semiconductor material layer into a dielectric layer by oxidation or nitridation prior to the implanting; and forming a shallow trench isolation structure directly on the dielectric layer after the implanting.

In yet another embodiment, the carbon-containing semiconductor layer is formed by ion implantation of carbon ions into the p– doped semiconductor layer located on a sidewall and a bottom surface of the shallow trench.

In still another embodiment, the method further comprises forming a dielectric pad layer on a top surface of the p– doped semiconductor layer, and the carbon-doped layer is formed by selective deposition on surfaces of the p– doped semiconductor layer within the shallow trench, while not depositing on the dielectric pad layer.

In a further embodiment, the carbon-doped layer comprises silicon, and wherein a carbon concentration of the carbon-containing semiconductor layer is from about 0.1% to about 5% in atomic concentration.

In further another embodiment, the method further comprises forming a transfer transistor on the semiconductor substrate, wherein the transfer transistor comprises a floating drain located in the semiconductor substrate, a gate dielectric vertically abutting a top surface of the p– doped semiconductor layer, a gate electrode vertically abutting the gate dielectric, wherein the n-type charge collection well functions as a source of the transfer transistor.

According to yet another aspect of the present invention, a design structure embodied in a machine readable medium for designing, manufacturing, or testing a design is provided. The design structure comprising:

a first data representing a p– doped semiconductor layer located in a semiconductor substrate;

a second data representing an n-type charge collection well vertically abutting the p– doped semiconductor layer;

a third data representing a surface pinning layer having a p-type doping and vertically abutting a top surface of the n-type charge collection well and laterally abutting a sidewall of the n-type charge collection well;

a fourth data representing a carbon-containing semiconductor layer comprising a semiconductor material and carbon and laterally abutting the surface pinning layer and a substantially vertical portion of a dielectric layer and vertically abutting a horizontal portion of the dielectric layer; and a fifth data representing a shallow trench isolation structure abutting the dielectric layer.

In one embodiment, the design structure comprises a netlist.

In another embodiment, the design structure resides on storage medium as a data format used for exchange of layout data of integrated circuits.

In yet another embodiment, the method further comprises a sixth data representing a p+ doped semiconductor layer located directly underneath the p– doped semiconductor layer.

In still another embodiment, the method further comprise a seventh data representing a transfer transistor, the seventh data including:

an eighth data representing a floating drain located in the semiconductor substrate, and a ninth data representing a gate electrode, wherein the n-type charge collection well functions as a source of the transfer transistor.

In still yet another embodiment, a portion of the p– doped semiconductor layer and the n-type charge collection well and the p-type well are designed to function as a photodiode. The p– doped semiconductor layer may optionally include a p-type well vertically abutting the n-type charge collection well.

BRIEF DESCRIPTION OF THE DRAWINGS

FIGS. 2A-7B are sequential views of a first exemplary semiconductor structure according to the present invention. Figures with the suffix "A" are top-down views. Figures with the suffix "B" are vertical cross-sectional views along the plane X-X' of the corresponding figure with the same numeric label and the suffix "A."

FIGS. 9A-12B are sequential views of a third exemplary semiconductor structure according to the present invention. Figures with the suffix "A" are top-down views. Figures with the suffix "B" are vertical cross-sectional views along the plane X-X' of the corresponding figure with the same numeric label and the suffix "A."

FIG. 20 is a flow diagram of a design process used in semiconductor design and manufacture of the semiconductor structure according to the present invention.

DETAILED DESCRIPTION

Figure 1:
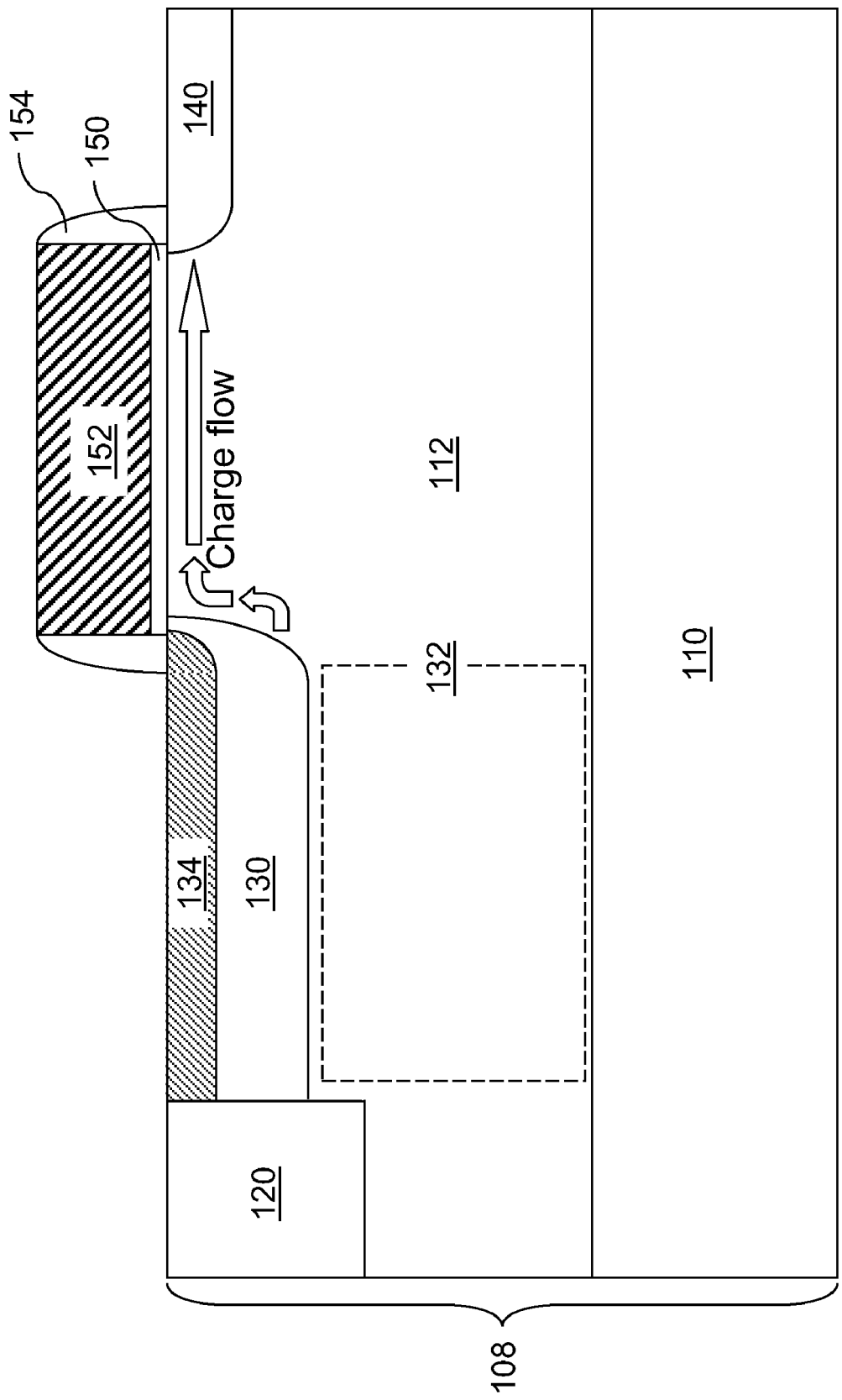
FIG. 1 is a vertical cross-sectional view of an exemplary prior art semiconductor structure for a CMOS image sensor pixel.

As stated above, the present invention relates to a complementary metal oxide semiconductor (CMOS) image sensor structure formed on a semiconductor substrate containing a silicon-carbon layer abutting sidewalls and bottom surfaces of a shallow trench isolation structure, and methods of manufacturing the same, which are now described in detail with accompanying figures. It is noted that like and corresponding elements are referred to by like names or reference numerals in the figures.

Referring to FIGS. 2A and 2B, a first exemplary semiconductor structure according to the first embodiment of the present invention comprises a semiconductor substrate 8 which includes a p– doped semiconductor layer 12 containing a shallow trench 11. A dielectric pad layer 13 is deposited on a top surface of the semiconductor substrate 8 and is lithographically patterned. The pattern in the dielectric pad layer 13 is transferred into the p– doped semiconductor layer 12 to form the shallow trench 11. The dielectric pad layer 13 comprises a dielectric material such as silicon nitride or silicon oxide. The dielectric pad layer 13 may also comprise a stack of multiple dielectric material layers such as a silicon oxide layer and a silicon nitride layer. The thickness of the dielectric pad layer 13 may be from about 50 nm to about 300 nm, and typically from about 100 nm to about 200 nm, although lesser and greater thicknesses are also contemplated herein. The dielectric pad layer 13 may be formed by low pressure chemical vapor deposition (LPCVD), rapid thermal chemical vapor deposition (RTCVD), plasma enhanced chemical vapor deposition (PECVD), high density plasma chemical vapor deposition (HDPCVD), etc.

The p− doped semiconductor layer 12 comprises a semiconductor material having a p− doping, which is a low concentration doping with p-type dopants. For example, the p− ("p minus") doped semiconductor layer 12 may have a dopant concentration from about $1.0\times10^{14}/cm^3$ to about $1.0\times10^{19}/cm^3$, and typically from about $3.0\times10^{15}/cm^3$ to about $3.0\times10^{18}/cm^3$. Non-limiting examples of the semiconductor material that may constitute the p− doped semiconductor layer 12 include one of silicon, a silicon germanium alloy, silicon, germanium, a silicon-germanium alloy, a silicon carbon alloy, a silicon-germanium-carbon alloy, gallium arsenide, indium arsenide, indium gallium arsenide, indium phosphide, lead sulfide, other III-V compound semiconductor materials, and II-VI compound semiconductor materials. For example, silicon may be employed for the semiconductor material, i.e., the p− doped semiconductor layer 12 may comprise a p− doped silicon. Preferably, the p− doped semiconductor layer 12 is single crystalline, i.e., the semiconductor material is epitaxially aligned atomically within the entirety of the p− doped semiconductor layer 12.

The shallow trench 11 is formed in an area for providing electrical isolation between semiconductor devices to be formed in or on the p− doped semiconductor layer 12 by methods known in the art, which may include, for example, application and lithographic patterning of a photoresist (not shown) and an anisotropic etch that transfers the pattern in the photoresist into exposed portions of the p− doped semiconductor layer 12. A recessed p− doped semiconductor surface 12R is formed at the bottom of the shallow trench 11. The p− doped semiconductor layer 12 includes a photodiode region 12P in which a photodiode is to be subsequently formed and a device region 12D in which a semiconductor device may be subsequently formed. The photodiode region 12P and the device region 12D are located outside the area of the shallow trench 11 as seen in the top-down view of FIG. 2A. The depth of the shallow trench may be from about 150 nm to about 600 nm, and typically from about 200 nm to about 500 nm, although lesser and greater thicknesses are also contemplated herein.

Referring to FIGS. 3A and 3B, a carbon-containing semiconductor layer 14 is deposited on p− doped semiconductor sidewalls 12S and the recessed p− doped semiconductor surface 12R. The p− doped semiconductor sidewalls 12S are sidewalls of the p− doped semiconductor layer 12 that are exposed to the shallow trench 11, i.e., the p− doped semiconductor sidewalls 12S are sidewalls of the shallow trench 11 prior to the deposition of the carbon-containing semiconductor layer 14. The carbon-containing semiconductor layer 14 is formed by a selective deposition method such as selective epitaxial growth. In this case, the carbon-containing semiconductor layer 14 is a single crystalline carbon-doped semiconductor layer. Solid phase epitaxy or a high temperature anneal may be used in combination with the deposition to improve the crystalline quality of the carbon-containing semiconductor layer 14.

The carbon-containing semiconductor layer 14 comprises an alloy of a semiconductor material and carbon. Preferably, the semiconductor material in the carbon-containing semiconductor layer 14 is the same material as the material of the p− doped semiconductor layer 12. For example, if the p− doped semiconductor layer 12 comprises silicon, the carbon-containing semiconductor layer 14 may also comprise silicon. The thickness and concentration of carbon within the carbon-containing semiconductor layer 14 is preferably within the range that maintains epitaxial alignment between the carbon-containing semiconductor layer 14 and the p− doped semiconductor layer 12. For example, if the p− doped semiconductor layer 12 comprises silicon, the carbon concentration of the carbon-containing semiconductor layer 14 may be from about 0.1% to about 5%, and the thickness of the carbon-containing semiconductor layer 14 may be from about 5 nm to about 200 nm, and typically from about 10 nm to about 100 nm. The semiconductor material of the carbon-containing semiconductor layer 14 is not necessarily the same as the semiconductor material of the p− doped semiconductor layer 12, and depending on the type of semiconductor materials and lattice mismatch, the concentration of carbon and the thickness of the carbon-containing semiconductor layer 14 may be varied as needed. Typically, the carbon-containing semiconductor layer 14 is deposited as an intrinsic layer. However, the carbon-containing semiconductor layer 14 may also be formed with in-situ doping as needed.

In case the carbon-containing semiconductor layer 14 comprises silicon doped with carbon, i.e., the carbon-containing semiconductor layer 14 is a carbon-containing silicon layer, the deposition process may employ a reactant such as silane ($SiH_4$), disilane ($Si_2H_6$), dichlorosilane ($SiH_2Cl_2$), trichlorosilane ($SiHCl_3$), tetrachlorosilane ($SiCl_4$), or a combination thereof. Carbon atoms as dopants may be provided by methane ($CH_4$), ethane ($C_2H_6$), acetylene ($C_2H_2$), ethylene ($C_2H_4$), propane ($C_3H_8$), etc.

As described above, the carbon-containing semiconductor layer 14 is formed by a selective deposition so that the carbon-containing semiconductor layer 14 is formed on the p− doped semiconductor sidewalls 12S and the recessed p− doped semiconductor surface 12R, while no material is deposited on the surfaces of the dielectric pad layer 13. An etchant such as hydrogen chloride (HCl) may be employed to effect selective deposition of the carbon-containing semiconductor layer 14 on semiconductor surfaces, while preventing deposition of material on the dielectric surface. Concurrent or alternating use of etchant with reactants for selective deposition of a semiconductor material is known in the art.

A semiconductor material layer 16 is subsequently deposited on the carbon-containing semiconductor layer 14 on exposed surfaces of the carbon-containing semiconductor layer 14 including carbon-containing semiconductor sidewalls 14S. The semiconductor material layer 16 comprises a semiconductor material that may be the same as, or different from, the semiconductor material of the p− doped semiconductor layer 12 and the carbon-containing semiconductor layer 14. The semiconductor material layer 16 may be formed as an epitaxial layer having epitaxial registry with the carbon-containing semiconductor layer 14 located underneath, or may be formed as a polycrystalline layer or an amorphous layer. The thickness of the semiconductor material layer 16 may be from about 2.5 nm to about 100 nm, and typically from about 5 nm to about 50 nm. The semiconductor material layer 16, the carbon-containing semiconductor layer 14, and the p− doped semiconductor layer 12 may comprise the same semiconductor material, and be epitaxially aligned to one another as a single crystal. For example, the semiconductor material layer 16, the carbon-containing semiconductor layer 14, and the p− doped semiconductor layer 12 may comprise epitaxial silicon having epitaxial registry with one another.

The present invention may be practiced without the semiconductor material layer 16. Such variations are explicitly contemplated herein.

The semiconductor material layer 16 is formed by a selective deposition so that the semiconductor material layer 16 is formed on the carbon-containing semiconductor sidewalls 14S and a horizontal surface of the carbon-containing semiconductor layer 14 within the shallow trench 11, while no material is deposited on the surfaces of the dielectric pad layer 13. In case the semiconductor material layer 16 comprises silicon, the deposition process may employ a reactant such as silane ($SiH_4$), disilane ($Si_2H_6$), dichlorosilane ($SiH_2Cl_2$), trichlorosilane ($SiHCl_3$), tetrachlorosilane ($SiCl_4$), or a combination thereof. Concurrent or alternating use of etchant with reactants for selective deposition of a semiconductor material is known in the art.

Referring to FIGS. 4A and 4B, the semiconductor material layer 16 is converted into a dielectric layer 18 by oxidation or nitridation. This conversion process may employ thermal oxidation, thermal nitridation, plasma oxidation, plasma nitridation, or a combination thereof. For example, the semiconductor material layer 16 may comprise silicon, and the conversion process may be a thermal oxidation process of silicon into silicon oxide through wet thermal oxidation in an environment containing $H_2O$, or a dry thermal oxidation process in an environment containing $O_2$. A thermal nitridation process may be employed to form a stack of thermal oxide and thermal nitride, or a stack of thermal oxide and a thermal oxynitride. The conversion process may be tuned to stop on the outer surface of the carbon-containing semiconductor layer 14 such as the carbon-containing semiconductor sidewalls 14S. The thickness of the dielectric layer 18 is proportional to the thickness of the semiconductor material layer 16. Due to a volume expansion that typically accompanies such a conversion process, the thickness of the dielectric layer 18 may be from about 5 nm to about 200 nm, and typically from about 10 nm to about 100 nm.

Referring to FIGS. 5A and 5B, a photoresist 37 is applied over the top surfaces of the dielectric layer 18 and the dielectric pad layer 13 and lithographically patterned to define an area that includes the photodiode region 12P (See FIGS. 2A and 2B). An edge of the photoresist 37 may be located within the shallow trench 11, or may be located outside the shallow trench 11 over a top surface of the p− doped semiconductor layer 12 in the device region 12D (See FIG. 2A). P-type dopants, such as boron, gallium, and indium, are implanted into a contiguous region of the p− doped semiconductor layer 12 that includes a portion of the p− doped semiconductor layer 12 beneath the shallow trench, another portion of the p−doped semiconductor layer 12 abutting a vertical portion of the carbon-containing semiconductor layer 14, and yet another portion of the p− doped semiconductor layer 12 vertically abutting the photodiode region 12P. The implanted contiguous region constitutes a surface pinning layer 34 having a p-type doping at a dopant concentration higher than the dopant concentration of the unimplanted portions of the p− doped semiconductor layer 12, i.e., higher than the dopant concentration of the p− doped semiconductor layer 12 prior to the implantation. The dopant concentration of the surface pinning layer 34 may be from about $1.0\times10^{17}/cm^3$ to about $1.0\times10^{21}/cm^3$, and typically from about $1.0\times10^{18}/cm^3$ to about $1.0\times10^{20}/cm^3$, although lesser and greater dopant concentrations are explicitly contemplated herein also. The photoresist 37 is subsequently removed.

Referring to FIGS. 6A and 6B, a shallow trench isolation structure 20 is formed within the shallow trench 11 by deposition of a dielectric material such as silicon oxide, followed by a planarization process. The dielectric pad layer 13 may be employed as a stopping layer for the planarization process. The shallow trench isolation structure 20 is recessed to be substantially coplanar with a top surface of the semiconductor substrate 8. The dielectric pad layer 13 is thereafter removed selective to the shallow trench isolation structure 20. For example, if the dielectric pad layer 13 comprises silicon nitride and the shallow trench isolation structure 20 comprises silicon oxide, the dielectric pad layer 13 may be removed selective to the shallow trench isolation structure by a wet etch employing a hot phosphoric acid. Any protruding portions of the carbon-containing semiconductor layer 14 and the dielectric layer 18 may also be removed prior to, concurrently with, or after the removal of the dielectric pad layer 13 so that exposed surfaces of the carbon-containing semiconductor layer 14 and the dielectric layer 18 are substantially coplanar with top surfaces of the shallow trench isolation structure 20 and/or the p− doped semiconductor layer 12.

Referring to FIGS. 7A and 7B, p-type dopants are implanted into a top portion of the p− doped semiconductor layer 12 to form another doped region, which is contiguous with the surface pinning layer 34. Thus, the surface pinning layer 34 is extended to include regions abutting a top surface of the semiconductor substrate 8. The dopant concentration of the surface pinning layer 34, including a first portion abutting the carbon-containing semiconductor layer 14 and a second portion abutting the top surface of the semiconductor substrate 8, may be from about $1.0\times10^{17}/cm^3$ to about $1.0\times10^{21}/cm^3$, and typically from about $1.0\times10^{18}/cm^3$ to about $1.0\times10^{20}/cm^3$, although lesser and greater dopant concentrations are explicitly contemplated herein also. Optionally, a photoresist (not shown) may be employed to block an area of the p−doped semiconductor layer 12 to prevent implantation of the p-type dopants into the blocked area.

Figure 8:
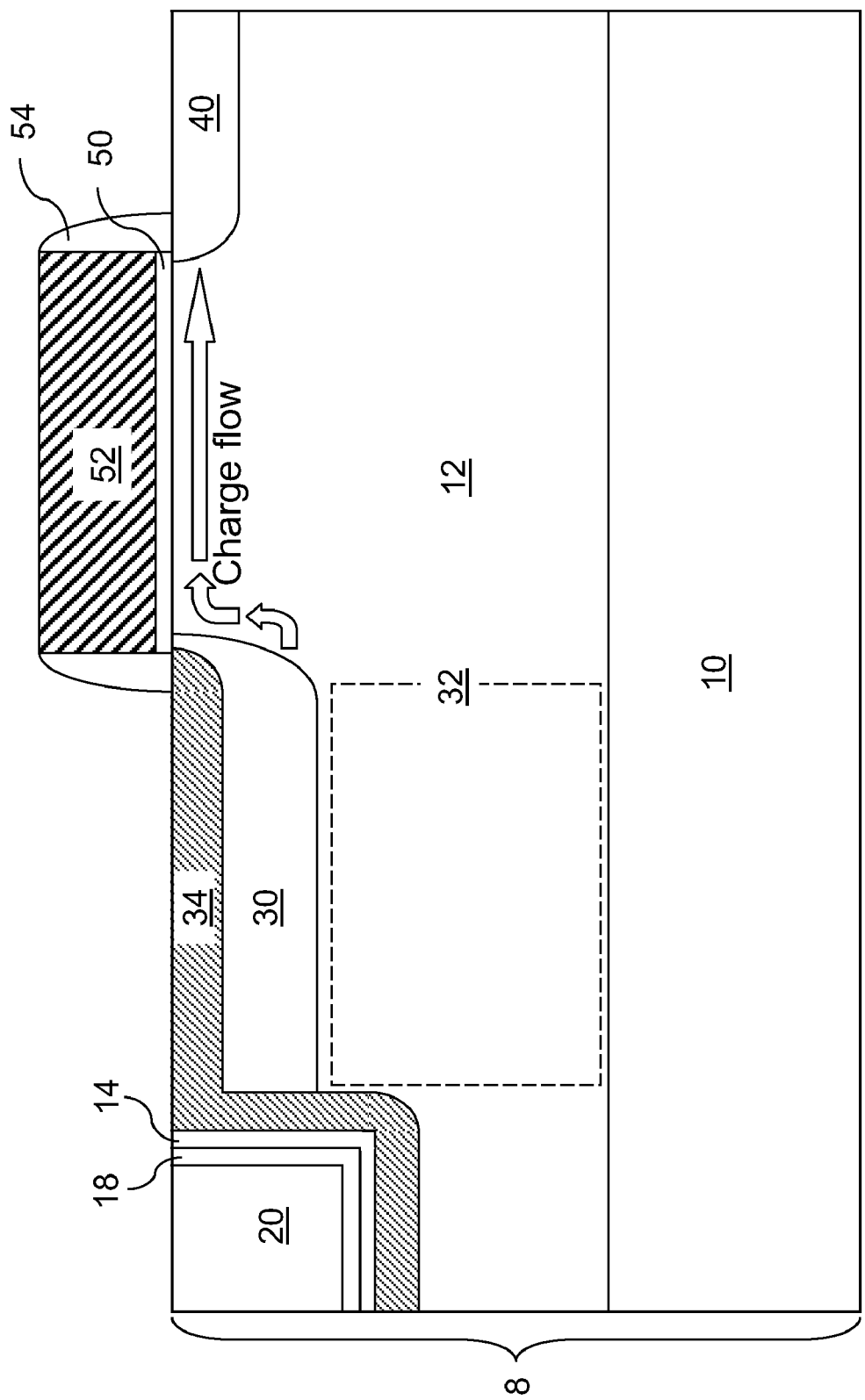
FIG. 8 is a vertical cross-sectional view of a second exemplary semiconductor structure according the present invention, which incorporates the features of the first exemplary semiconductor structure and may be employed for a CMOS image sensor pixel.

Referring to FIG. 8, a second exemplary semiconductor structure according to a second embodiment of the present invention incorporates the structural and compositional features of the first exemplary semiconductor structure, which include a p− doped semiconductor layer 12, a surface pinning layer 34, a carbon-containing semiconductor layer 14, a dielectric layer 18, and a shallow trench isolation structure 20. The second exemplary semiconductor structure further comprises an n-type charge collection well 30, which is formed directly underneath the surface pinning layer 34 by a masked ion implantation of n-type dopants. The dopant concentration of the n-type charge collection well 30 may be from about $1.0\times10^{16}/cm^3$ to about $1.0\times10^{21}/cm^3$, and typically from about $1.0\times10^{17}/cm^3$ to about $1.0\times10^{19}/cm^3$, although lesser and greater dopant concentrations are explicitly contemplated herein also. The p− doped semiconductor layer 12 includes a p-type well 32 located directly beneath the n-type charge collection well 30. The p-type well 32 may have the same dopant concentration as the p− doped semiconductor layer 12, or alternately, may be doped with additional p-type dopants for enhanced performance. The dopant concentration of the p-type well 32 may be from about $3.0\times10^{15}/cm^3$ to about $3.0\times10^{19}/cm^3$, and typically from about $1.0\times10^{16}/cm^3$ to about $1.0\times10^{19}/cm^3$, although lesser and greater dopant concentrations are explicitly contemplated herein also. The thickness of the p-type well 32 may be from about 500 nm to about 5,000 nm, and typically from about 1,000 nm to about 3,000 nm.

The p-type well 32 and the n-type charge collection well 30 collectively comprise a photodiode (32, 30) that generates electron-hole pairs. The electrons are collected in the n-type charge collection well 30 in proportion to the amount of photons impinging into the photodiode (32, 30). The second exemplary semiconductor structure further comprises a transfer transistor comprising a floating drain 40, a gate dielectric 50 vertically abutting a top surface of the p– doped semiconductor layer 12 and overlying a portion of the n-type charge collection well 30, and a gate electrode 52 formed directly on the gate dielectric 50. The n-type charge collection well 30 functions as a source of the transfer transistor. When the transfer transistor is turned on, the electrons in the n-type charge collection well 30 are transferred into the floating drain 40, which stores electrical charge as data from the photodiode (30, 32) until a read circuit detects the amount of stored charge.

Referring to FIGS. 9A and 9B, a third exemplary semiconductor structure according to a third embodiment of the present invention is derived from the first exemplary semiconductor structure of FIGS. 2A and 2B. In the third embodiment, a carbon-containing semiconductor layer 14 is formed by a non-selective deposition method such as non-selective epitaxial growth, molecular beam epitaxy (MBE), low pressure chemical vapor deposition (LPCVD), rapid thermal chemical vapor deposition (RTCVD), etc. Due to the non-selective nature of the deposition process, the carbon-containing semiconductor layer 14 is formed on the surfaces of the dielectric pad layer 13 as well as on the p– doped semiconductor sidewalls 12S and the recessed p– doped semiconductor surface 12R.

The carbon-containing semiconductor layer 14 comprises an alloy of a semiconductor material and carbon. Preferably, the semiconductor material in the carbon-containing semiconductor layer 14 is the same material as the material of the p– doped semiconductor layer 12. For example, if the p– doped semiconductor layer 12 comprises silicon, the carbon-containing semiconductor layer 14 may also comprise silicon. The thickness and concentration of carbon within the carbon-containing semiconductor layer 14, as measured on the p– doped semiconductor sidewalls 12S or the recessed p– doped semiconductor surface 12R, is preferably within the range that maintains epitaxial alignment between the carbon-containing semiconductor layer 14 and the p– doped semiconductor layer 12. For example, if the p– doped semiconductor layer 12 comprises silicon, the carbon concentration of the carbon-containing semiconductor layer 14 may be from about 0.1% to about 5%, and the thickness of the carbon-containing semiconductor layer 14 may be from about 5 nm to about 200 nm, and typically from about 10 nm to about 100 nm.

The portion of the carbon-containing semiconductor layer 14 on the dielectric pad layer 13 is amorphous or polycrystalline since the dielectric pad layer does not provide any template to which any epitaxial registry of the material in that portion of the carbon-containing semiconductor layer 14 can be made. The semiconductor material of the carbon-containing semiconductor layer 14 is not necessarily the same as the semiconductor material of the p– doped semiconductor layer 12, and depending on the type of semiconductor materials and lattice mismatch, the concentration of carbon and the thickness of the carbon-containing semiconductor layer 14 may be varied as needed. Typically, the carbon-containing semiconductor layer 14 is deposited as an intrinsic layer. However, the carbon-containing semiconductor layer 14 may also be formed with in-situ doping as needed. In case the carbon-containing semiconductor layer 14 comprises silicon doped with carbon, the deposition process may employ any of the reactants described in the first embodiment for deposition of a carbon-containing silicon layer.

A semiconductor material layer 16 is subsequently deposited on the carbon-containing semiconductor layer 14 on exposed surfaces of the carbon-containing semiconductor layer 14 including carbon-containing semiconductor sidewalls 14S. The semiconductor material layer 16 comprises the same material as in the first embodiment. The semiconductor material layer 16 may be formed as an epitaxial layer having epitaxial registry with the carbon-containing semiconductor layer 14 located underneath if the underlying portion of the carbon-containing semiconductor layer 14. In this case, the semiconductor material layer 16 is epitaxially aligned to an epitaxial portion of the carbon-containing semiconductor layer 14 within the shallow trench 11, but is amorphous or polycrystalline over the portions of the carbon-containing semiconductor layer 14 on the dielectric pad layer 13. Alternately, the entirety of the semiconductor material layer 16 may be formed as a polycrystalline layer or an amorphous layer. The thickness of the semiconductor material layer 16 may be from about 2.5 nm to about 100 nm, and typically from about 5 nm to about 50 nm. The semiconductor material layer 16, the carbon-containing semiconductor layer 14, and the p– doped semiconductor layer 12 may comprise the same semiconductor material, and may be epitaxially aligned to one another as a single crystal. For example, the semiconductor material layer 16, the carbon-containing semiconductor layer 14, and the p– doped semiconductor layer 12 may comprise epitaxial silicon having epitaxial registry with one another below the level of the interface between the dielectric pad layer 13 and the p– doped semiconductor layer 12. The present invention may be practiced without the semiconductor material layer 16. Such variations are explicitly contemplated herein. In case the semiconductor material layer 16 comprises silicon, the deposition process may employ a reactant such as silane ($SiH_4$), disilane ($Si_2H_6$), dichlorosilane ($SiH_2Cl_2$), trichlorosilane ($SiHCl_3$), tetrachlorosilane ($SiCl_4$), or a combination thereof.

Referring to FIGS. 10A and 10B, the semiconductor material layer 16 is converted into a dielectric layer 18 by oxidation or nitridation. This conversion process may employ thermal oxidation, thermal nitridation, plasma oxidation, plasma nitridation, or a combination thereof as in the first embodiment. The thickness and composition of the dielectric layer 18 is substantially the same as in the first embodiment.

Referring to FIGS. 11A and 11B, a photoresist 37 is applied over the top surfaces of the dielectric layer 18 and lithographically patterned to define an area that includes the photodiode region 12P (See FIGS. 2A and 2B). An edge of the photoresist 37 may be located within the shallow trench 11, or may be located outside the shallow trench 11 over a top surface of the p– doped semiconductor layer 12 in the device region (See FIG. 2A). A surface pinning layer 34 is formed in the same manner as in the first embodiment.

Referring to FIGS. 12A and 12B, a shallow trench isolation structure 20 is formed within the shallow trench 11 by deposition of a dielectric material such as silicon oxide, followed by a planarization process. The same processing steps may be employed as in the first embodiment recessed the shallow trench isolation structure 20, and to remove the dielectric pad layer 13. Any protruding portions of the carbon-containing semiconductor layer 14 and the dielectric layer 18 may also be removed so that exposed surfaces of the carbon-containing semiconductor layer 14 and the dielectric layer 18 are substantially coplanar with top surfaces of the shallow trench isolation structure 20 and/or the p– doped semiconductor layer 12. P-type dopants are implanted into a top portion of the p– doped semiconductor layer 12 to form another doped region, which is contiguous with the surface pinning layer 34. Thus, the surface pinning layer 34 is extended to include regions abutting a top surface of the semiconductor substrate

8 as in the first embodiment. The dopant concentration of the surface pinning layer 34 is substantially the same as in the first embodiment. A photoresist (not shown) may be employed to block an area of the p− doped semiconductor layer 12 to prevent implantation of the p-type dopants into the blocked area.

The third exemplary semiconductor structure at this stage is substantially the same as the first exemplary semiconductor structure at the processing step corresponding to FIGS. 7A and 7B. As such, the third exemplary semiconductor structure may be employed, for example, in the second exemplary semiconductor structure instead of the first exemplary semiconductor structure to generate a structure similar to the second exemplary semiconductor structure.

Figure 13B:
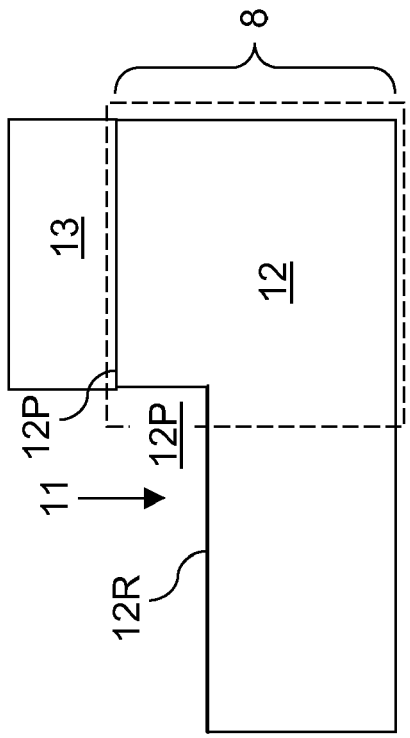
FIGS. 13A-18B are sequential views of a fourth exemplary semiconductor structure according to the present invention. Figures with the suffix "A" are top-down views. Figures with the suffix "B" are vertical cross-sectional views along the plane X-X' of the corresponding figure with the same numeric label and the suffix "A."
Figure 13A:
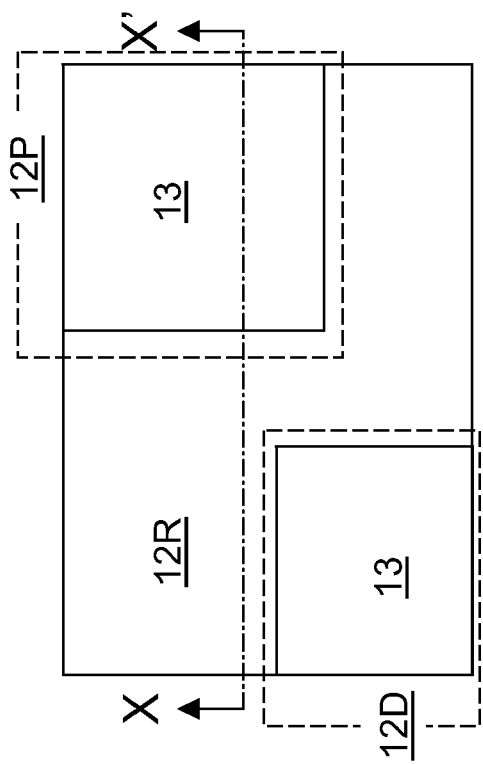

Referring to FIGS. 13A and 13B, a fourth exemplary semiconductor structure according to a fourth embodiment of the present invention comprises a semiconductor substrate 8 which includes a p− doped semiconductor layer 12 containing a shallow trench 11. A dielectric pad layer 13 is deposited on a top surface of the semiconductor substrate 8 and is lithographically patterned. The pattern in the dielectric pad layer 13 is transferred into the p− doped semiconductor layer 12 to form the shallow trench 11. The dielectric pad layer 13 has the same composition and thickness as, and may be formed by the same methods as, in the first embodiment.

The p− doped semiconductor layer 12 comprises a semiconductor material having a p− doping, which is a low concentration doping with p-type dopants. The composition of the p− doped semiconductor layer 12 may be substantially the same as in the first embodiment. Preferably, the p− doped semiconductor layer 12 is single crystalline, i.e., the semiconductor material is epitaxially aligned atomically within the entirety of the p− doped semiconductor layer 12.

The shallow trench 11 is formed in an area for providing electrical isolation between semiconductor devices to be formed in or on the p− doped semiconductor layer 12 by methods known in the art. A recessed p− doped semiconductor surface 12R is formed at the bottom of the shallow trench 11. The p− doped semiconductor layer 12 includes a photodiode region 12P in which a photodiode is to be subsequently formed and a device region 12D in which a semiconductor device may be subsequently formed. The photodiode region 12P and the device region 12D are located outside the area of the shallow trench 11. The depth of the shallow trench may be from about 150 nm to about 600 nm, and typically from about 200 nm to about 500 nm, although lesser and greater thicknesses are also contemplated herein.

Figure 14B:
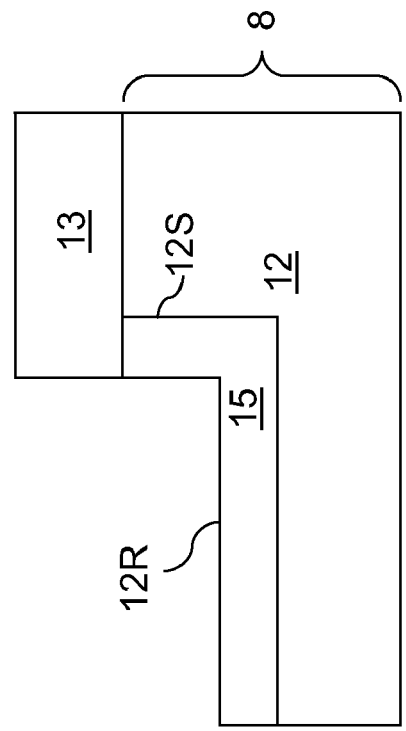
Figure 14A:
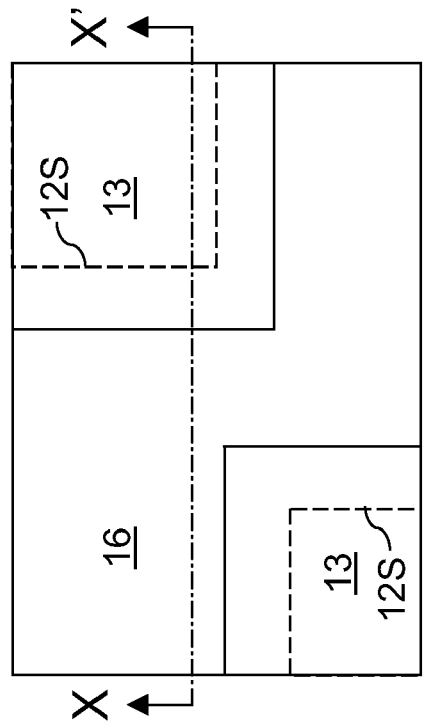

Referring to FIGS. 14A and 14B, carbon ions are implanted into the p− doped semiconductor layer 12 in an ion implantation process. An angled ion implantation may be employed to implant the carbon ions through substantially vertical trench sidewalls. The implanted carbon ions form a carbon-containing semiconductor layer 15 inside the trench sidewalls and beneath the recessed p− doped semiconductor surface 12R. Typically, the carbon-containing semiconductor layer 15 may be a singe crystalline carbon-doped semiconductor layer. The carbon-containing semiconductor layer 15 comprises the same semiconductor material as the p− doped semiconductor layer 12 and additionally comprises carbon. A high temperature anneal may be employed immediately after the carbon implantation or at a subsequent processing step to heal structural damages to the crystalline structure in the carbon-containing semiconductor layer 15.

The carbon concentration of the carbon-containing semiconductor layer 15 may be from about 0.1% to about 5%, and the thickness of the carbon-containing semiconductor layer 15 may be from about 5 nm to about 200 nm, and typically from about 10 nm to about 100 nm. The energy, dose, and the implantation angle are adjusted to optimize the thickness and the carbon concentration of the carbon-containing semiconductor layer 15.

Figure 15A:
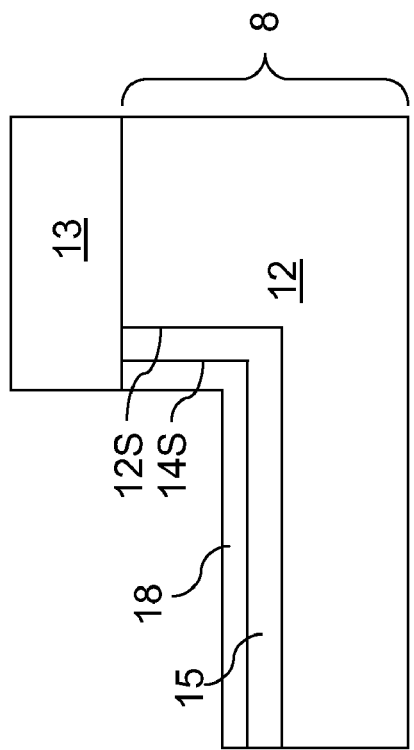
Figure 15B:
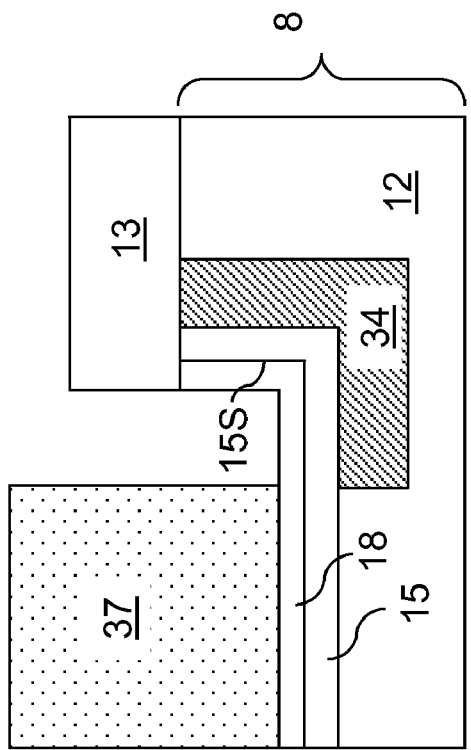

Referring to FIGS. 15A and 15B, the semiconductor material layer 16 is converted into a dielectric layer 18 by oxidation or nitridation. This conversion process may employ thermal oxidation, thermal nitridation, plasma oxidation, plasma nitridation, or a combination thereof. Therefore, the dielectric layer 18 comprises an oxide, an oxynitride, and/or a nitride of the semiconductor material of the p− doped semiconductor layer 12. For example, if the p− doped semiconductor layer 12 comprises silicon, the dielectric layer 18 comprises silicon oxide, silicon oxynitride, and/or silicon nitride. If the semiconductor material layer 16 comprises silicon, the conversion process may be a thermal oxidation process of silicon into silicon oxide through wet thermal oxidation in an environment containing $H_2O$, or a dry thermal oxidation process in an environment containing $O_2$. Other conversion processes described in the first embodiment may also be employed as well.

Figure 16A:
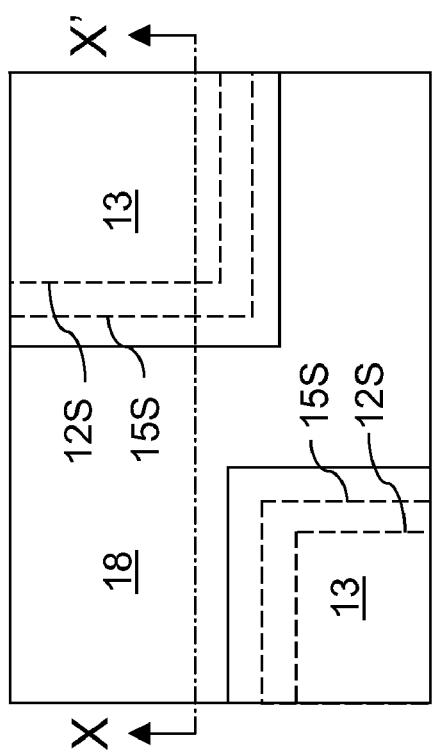
Figure 16B:
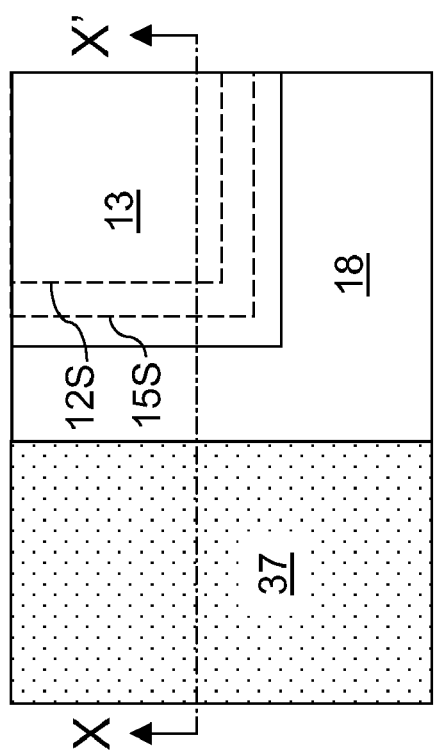

Referring to FIGS. 16A and 16B, a photoresist 37 is applied over the top surfaces of the dielectric layer 18 and the dielectric pad layer 13 and lithographically patterned to define an area that includes the photodiode region 12P (See FIGS. 13A and 13B). An edge of the photoresist 37 may be located within the shallow trench 11, or may be located outside the shallow trench 11 over a top surface of the p− doped semiconductor layer 12 in the device region 12D (See FIG. 13A). P-type dopants, such as boron, gallium, and indium, are implanted into a contiguous region of the p− doped semiconductor layer 12 that includes a portion of the p− doped semiconductor layer 12 beneath the shallow trench, another portion of the p− doped semiconductor layer 12 abutting a vertical portion of the carbon-containing semiconductor layer 15, and yet another portion of the p− doped semiconductor layer 12 vertically abutting the photodiode region 12P. The implanted contiguous region constitutes a surface pinning layer 34 having a p-type doping at a dopant concentration higher than the dopant concentration of the unimplanted portions of the p− doped semiconductor layer 12, i.e., higher than the dopant concentration of the p− doped semiconductor layer 12 prior to the implantation. The dopant concentration of the surface pinning layer 34 may be from about $1.0 \times 10^{16}/cm^3$ to about $1.0 \times 10^{20}/cm^3$, and typically from about $1.0 \times 10^{17}/cm^3$ to about $1.0 \times 10^{19}/cm^3$, although lesser and greater dopant concentrations are explicitly contemplated herein also. The photoresist 37 is subsequently removed.

Figure 17A:
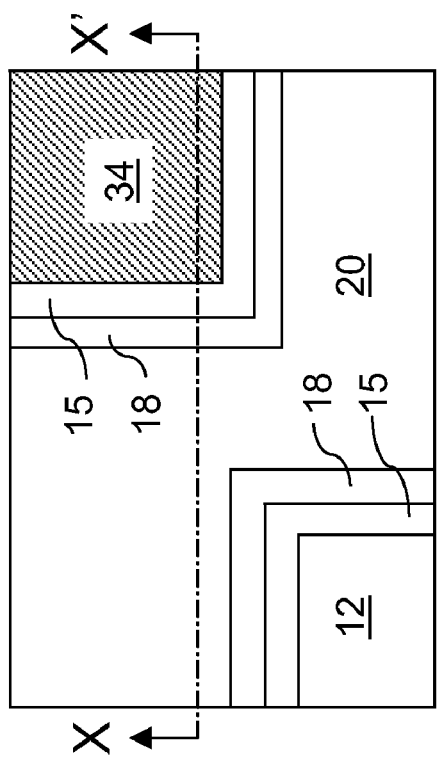
Figure 17B:
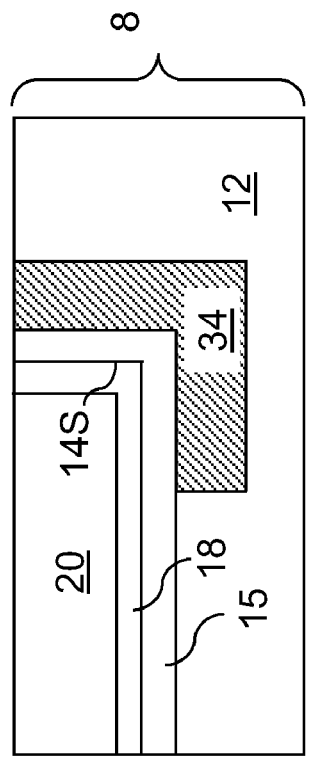

Referring to FIGS. 17A and 17B, a shallow trench isolation structure 20 is formed within the shallow trench 11 by deposition of a dielectric material such as silicon oxide, followed by a planarization process as in the first embodiment. The same processing steps may be employed as in the first embodiment recessed the shallow trench isolation structure 20, and to remove the dielectric pad layer 13. Any protruding portions of the carbon-containing semiconductor layer 15 and the dielectric layer 18 may also be removed so that exposed surfaces of the carbon-containing semiconductor layer 15 and the dielectric layer 18 are substantially coplanar with top surfaces of the shallow trench isolation structure 20 and/or the p− doped semiconductor layer 12.

Figure 18A:
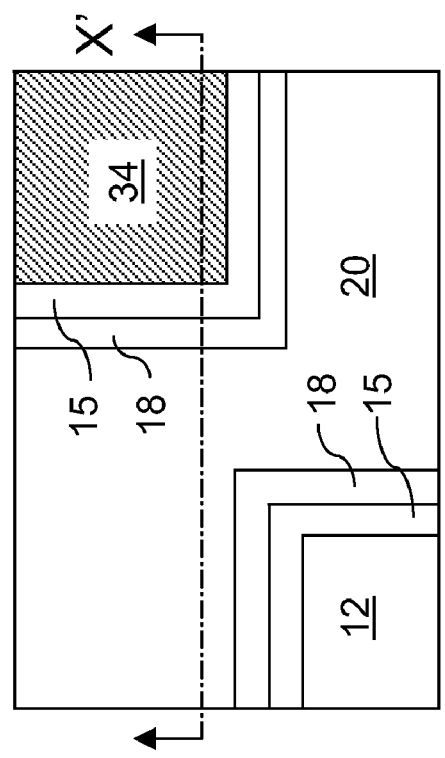
Figure 18B:
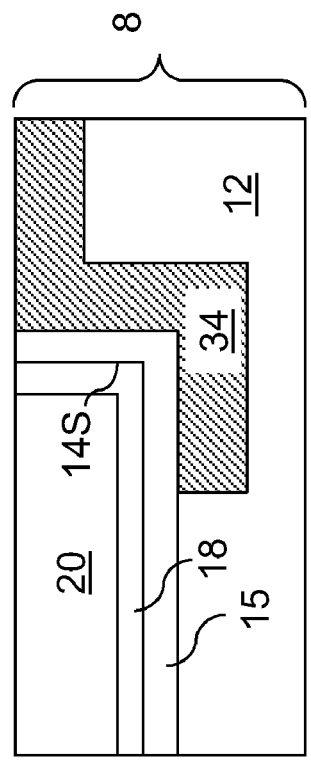

Referring to FIGS. 18A and 18B, p-type dopants are implanted into a top portion of the p− doped semiconductor layer 12 to form another doped region, which is contiguous with the surface pinning layer 34. Thus, the surface pinning layer 34 is extended to include regions abutting a top surface of the semiconductor substrate 8 as in the first embodiment.

The dopant concentration of the surface pinning layer 34 is substantially the same as in the first embodiment. A photoresist (not shown) may be employed to block an area of the p– doped semiconductor layer 12 to prevent implantation of the p-type dopants into the blocked area.

Figure 19:
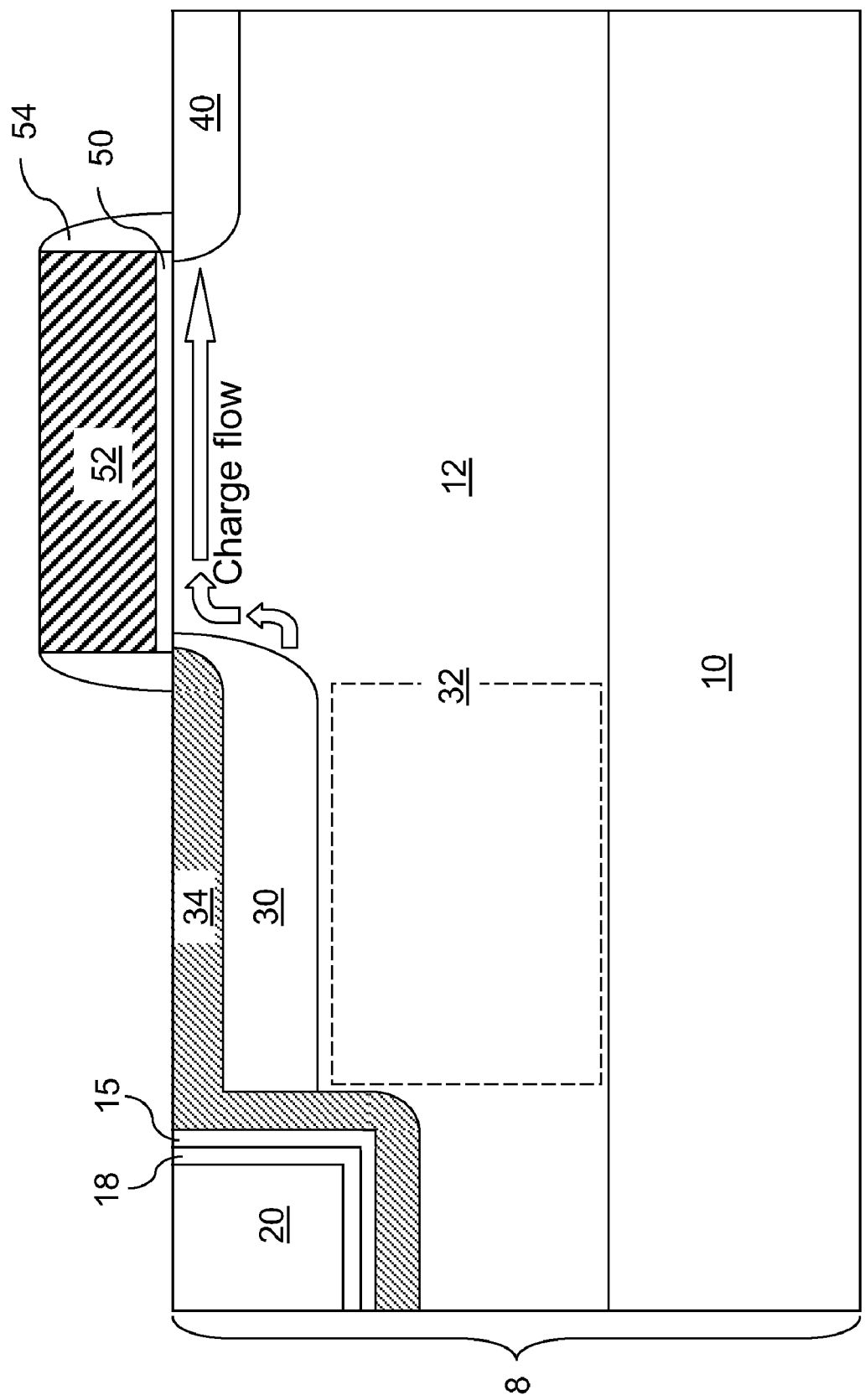
FIG. 19 is a vertical cross-sectional view of a fifth exemplary semiconductor structure according the present invention, which incorporates the features of the fourth exemplary semiconductor structure and may be employed for a CMOS image sensor pixel.

Referring to FIG. 19, a fifth exemplary semiconductor structure according to a fifth embodiment of the present invention incorporates the structural and compositional features of the fourth exemplary semiconductor structure, which include a p– doped semiconductor layer 12, a surface pinning layer 34, a carbon-containing semiconductor layer 15, a dielectric layer 18, and a shallow trench isolation structure 20. The second exemplary semiconductor structure further comprises an n-type charge collection well 30, which is formed directly underneath the surface pinning layer 34 by a masked ion implantation of n-type dopants. The dopant concentration of the n-type charge collection well 30 may be from about $1.0\times10^{16}/cm^3$ to about $1.0\times10^{20}/cm^3$, and typically from about $1.0\times10^{17}/cm^3$ to about $1.0\times10^{19}/cm^3$, although lesser and greater dopant concentrations are explicitly contemplated herein also. The p– doped semiconductor layer 12 includes a p-type well 32 located directly beneath the n-type charge collection well 30. The p-type well 32 may have the same dopant concentration as the p– doped semiconductor layer 12, or alternately, may be doped with additional p-type dopants for enhanced performance. The dopant concentration of the p-type well 32 may be from about $3.0\times10^{15}/cm^3$ to about $3.0\times10^{19}/cm^3$, and typically from about $1.0\times10^{16}/cm^3$ to about $1.0\times10^{19}/cm^3$, although lesser and greater dopant concentrations are explicitly contemplated herein also. The thickness of the p-type well 32 may be from about 500 nm to about 5,000 nm, and typically from about 1,000 nm to about 3,000 nm.

The p-type well 32 and the n-type charge collection well 30 collectively comprise a photodiode (32, 30) that generates electron-hole pairs. The electrons are collected in the n-type charge collection well 30 in proportion to the amount of photons impinging into the photodiode (32, 30). The second exemplary semiconductor structure further comprises a transfer transistor comprising a floating drain 40, a gate dielectric 50 vertically abutting a top surface of the p– doped semiconductor layer 12 and overlying a portion of the n-type charge collection well 30, and a gate electrode 52 formed directly on the gate dielectric 50. The n-type charge collection well 30 functions as a source of the transfer transistor. When the transfer transistor is turned on, the electrons in the n-type charge collection well 30 are transferred into the floating drain 40, which stores electrical charge as data from the photodiode (30, 32) until a read circuit detects the amount of stored charge.

FIG. 20 shows a block diagram of an exemplary design flow 900 used for example, in semiconductor design and manufacturing of semiconductor devices employing the inventive semiconductor structure of the present invention described above. Design flow 900 may vary depending on the type of IC being designed. For example, a design flow for building an application specific integrated circuit (ASIC) may differ from a design flow for designing a standard integrated circuit component. Design structure 920 is preferably an input to a design process 910 and may come from an intellectual property (IP) provider, a core developer, or a design company, or may be generated by the operator of a design flow, or may come from other sources.

Design structure 920 comprises an embodiment of present invention as shown in FIGS. 7A and 7B, FIG. 8, FIGS. 12A and 12B, FIGS. 18A and 18B, and/or FIG. 19 in the form of schematics or HDL, hardware description language (e.g. Verilog, VHDL, C, etc.). The design structure 920 may be contained on one or more machine readable medium. For example, design structure 920 may be a text file or a graphical representation of an embodiment of the inventive structures of the present invention described above.

Design process 910 preferably synthesizes (or translates) an embodiment of the invention as show in FIG. 2 into a netlist 980, where the netlist 980 is, for example, photodiodes, transfer transistors, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which the netlist 980 is resynthesized one or more times depending on design specifications and parameters for the circuit.

According to the present invention, the design structure 920 may be embodied in a machine readable medium for designing, manufacturing, or testing a design, and may comprise:

a first data representing a p– doped semiconductor layer 32 (See FIG. 8 or FIG. 19) containing a p-type well 32 (See FIG. 8 or FIG. 19) located in a semiconductor substrate 8;

a second data representing an n-type charge collection well 30 (See FIG. 8 or FIG. 19) vertically abutting the p-type well 32;

a third data representing a surface pinning layer 34 (See FIG. 8 or FIG. 19) having a p-type doping and vertically abutting a top surface of the n-type charge collection well 30 and laterally abutting a sidewall of the n-type charge collection well 30;

a fourth data representing a carbon-containing semiconductor layer (14 or 15; See FIG. 8 or FIG. 19) comprising a semiconductor material and carbon and laterally abutting the surface pinning layer 34 and a substantially vertical portion of a dielectric layer 18 (See FIG. 8 or FIG. 19) and vertically abutting a horizontal portion of the dielectric layer 18;

a fifth data representing a shallow trench isolation structure 20 (See FIG. 8 or FIG. 19) abutting the dielectric layer 18;

a sixth data representing a p+ doped semiconductor layer 10 (See FIG. 8 or FIG. 19) located directly underneath the p– doped semiconductor layer 12; and a seventh data representing a transfer transistor, in which the seventh data includes an eighth data representing a floating drain 40 (See FIG. 8 or FIG. 19) located in the semiconductor substrate 8 and a ninth data representing a gate electrode 52, wherein the n-type charge collection well 30 functions as a source of the transfer transistor.

The n-type charge collection well 30 and the p-type well 32 are designed to function as a photodiode, so that the second data and the third data collective represents a functional photodiode.

The design process 910 may include using a variety of inputs; for example, inputs from library elements 930 which may house a set of commonly used elements, circuits, and devices, including models, layouts, and symbolic representations, for a given manufacturing technology (e.g., different technology nodes such as 32 nm, 45 nm, and 90 nm, etc.), design specifications 940, characterization data 950, verification data 960, design rules 970, and test data files 985 (which may include, for example, standard circuit design processes such as timing analysis, verification, design rule checking, place and route operations, etc. One of ordinary skill in the art of integrated circuit design can appreciate the extent of possible electronic design automation tools and applications used in the design process 910 without deviating from the scope and spirit of the present invention. The design structure of the present invention is not limited to any specific design flow.

Design process 910 preferably translates an embodiment of the invention as shown in FIG. 2, along with any additional integrated circuit deign or data (if applicable), into a second design structure 990. Design structure 990 resides on a storage medium in a data format used for the exchange of layout data of integrated circuits and/or symbolic data format (e.g., information stored in GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing though the manufacturing line, and any other data required by a semiconductor manufacturer to produce an embodiment of the invention as shown in FIG. 2. Design structure 990 may then proceed to a stage 995 where, for example, design structure 990 proceeds to tape-out, is released to manufacturing, is released to a mask house, is sent to another design house, is sent back to a customer, etc.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a semiconductor structure comprising:
   forming a shallow trench in a p– doped semiconductor layer in a semiconductor substrate;
   forming a carbon-containing semiconductor layer on a sidewall surface and a bottom surface of said shallow trench;
   implanting p-type dopants into a portion of said p– doped semiconductor layer and forming a surface pinning layer having a p-type doping, wherein a dopant concentration of said surface pinning layer is higher than a dopant concentration of said p– doped semiconductor layer; and
   forming an n-type charge collection well underneath a top portion of said surface pinning layer, wherein said n-type charge collection well laterally abuts a vertical portion of said surface pinning layer.

2. The method of claim 1, wherein said carbon-containing semiconductor layer is deposited by epitaxial growth and is in epitaxial alignment with said p– doped semiconductor layer.

3. The method of claim 2, further comprising:
   depositing a semiconductor material layer directly on said carbon-containing semiconductor layer;
   converting said semiconductor material layer into a dielectric layer by oxidation or nitridation prior to said implanting; and
   forming a shallow trench isolation structure directly on said dielectric layer after said implanting.

4. The method of claim 1, wherein said carbon-containing semiconductor layer is formed by ion implantation of carbon ions into said p– doped semiconductor layer located on a sidewall and a bottom surface of said shallow trench.

5. The method of claim 1, further comprising forming a dielectric pad layer on a top surface of said p– doped semiconductor layer, wherein said carbon-doped layer is formed by selective deposition on surfaces of said p– doped semiconductor layer within said shallow trench, while not depositing on said dielectric pad layer.

6. The method of claim 1, wherein said carbon-doped layer comprises silicon, and wherein a carbon concentration of said carbon-containing semiconductor layer is from about 0.1% to about 5% in atomic concentration.

7. The method of claim 1, further comprising forming a transfer transistor on said semiconductor substrate, wherein said transfer transistor comprises a floating drain located in said semiconductor substrate, a gate dielectric vertically abutting a top surface of said p– doped semiconductor layer, a gate electrode vertically abutting said gate dielectric, wherein said n-type charge collection well functions as a source of said transfer transistor.

* * * * *